United States Patent [19]
Long

[11] Patent Number: 5,886,575
[45] Date of Patent: Mar. 23, 1999

[54] APPARATUS AND METHOD FOR AMPLIFYING A SIGNAL

[75] Inventor: James Frank Long, Glen Ellyn, Ill.

[73] Assignee: Motorola, Inc., Schaumburg, Ill.

[21] Appl. No.: 940,563

[22] Filed: Sep. 30, 1997

[51] Int. Cl.$^6$ ..................................................... H03G 3/20
[52] U.S. Cl. ........................... 330/129; 330/134; 330/284
[58] Field of Search ................................. 330/124 R, 129, 330/133, 134, 136, 284, 285

[56] References Cited

U.S. PATENT DOCUMENTS

| | | | |
|---|---|---|---|
| 3,900,823 | 8/1975 | Sokal et al. | 330/129 X |
| 5,179,353 | 1/1993 | Miyake | 330/129 |
| 5,420,541 | 5/1995 | Upton et al. | 330/286 |
| 5,757,229 | 5/1998 | Mitzlaff | 330/134 X |

Primary Examiner—Steven Mottola

[57] ABSTRACT

The apparatus includes an amplifier (204) having an input and an output, the amplifier output coupled to an input of a Doherty amplifier (208). The Doherty amplifier (208) includes a control input and a Doherty output. The apparatus further includes a detector (224) having an input coupled to the output of the Doherty amplifier (208). The detector provides a detected signal at its output, to a controller (228), the controller responding to the detected signal by producing a first (230) and second control output (231). The first control output is coupled to a switching regulator (232) input, the switching regulator having an output coupled to the control input of the Doherty amplifier. The second control output is coupled to a control input of a variable attenuator (202), the output of the variable attenuator coupled to the input of the amplifier (204).

23 Claims, 7 Drawing Sheets

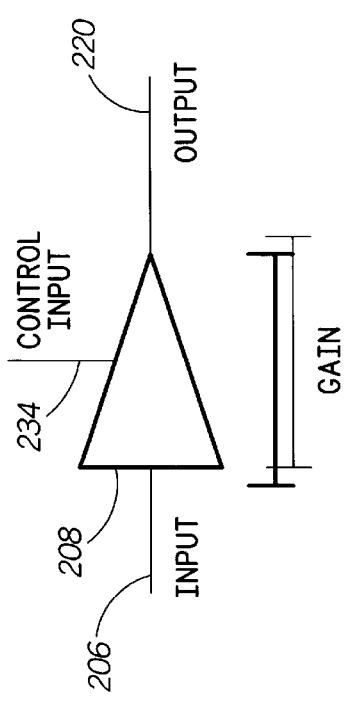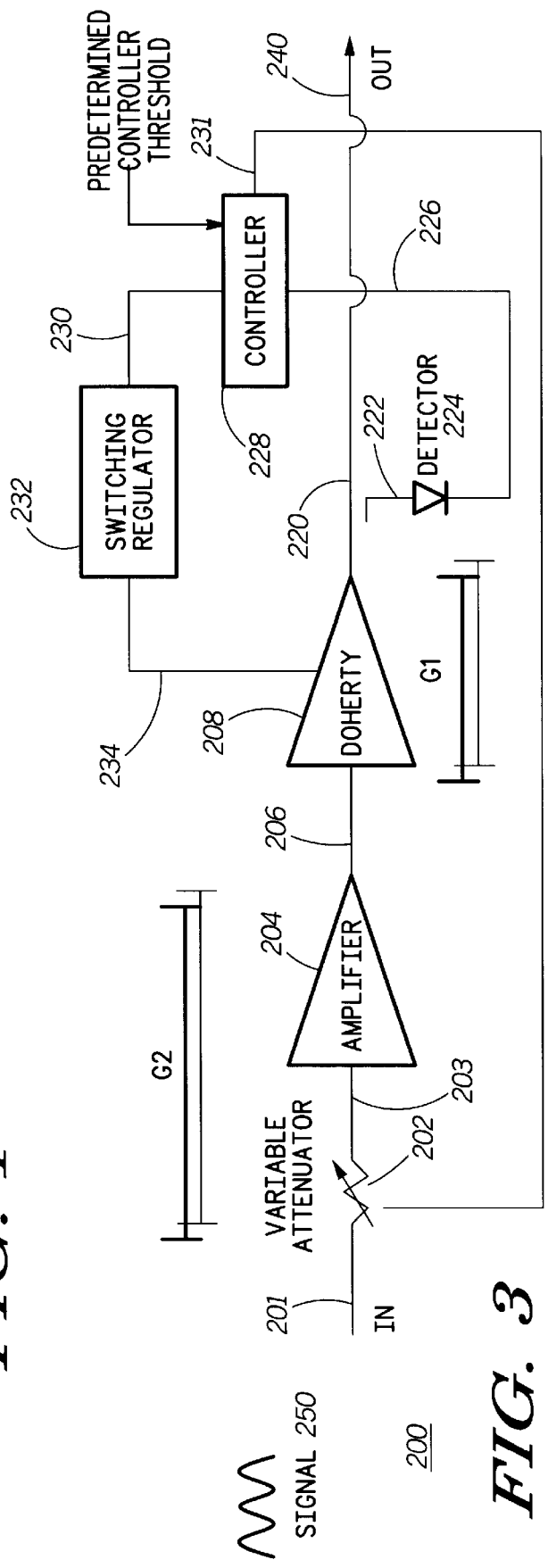

5,886,575

APPARATUS AND METHOD FOR AMPLIFYING A SIGNAL

FIELD OF THE INVENTION

The present invention relates generally to amplifiers, and, more particularly to an apparatus and method for amplifying a signal.

BACKGROUND OF THE INVENTION

High efficiency linear amplifiers such as Doherty amplifiers are well known to those skilled in the art. However, it is also well known that Doherty amplifiers typically have relatively poor linearity. In addition, their linearity is typically inversely proportional to their efficiency. As a result, although Doherty amplifiers can improve the performance of high peak-to-average ratio linear amplifiers, they may only do so over a narrow dynamic range.

At least one attempt has been made to design a Doherty amplifier which can operate with high efficiency over a wider dynamic range by nesting Doherty amplifiers, and is described in "Efficiency of Doherty radio frequency (RF)-power amplifier systems", F. Raab, Green Mountain Radio Research Company, RN84-23, August, 1984. Nesting Doherty amplifiers as described in the Rabb implementation requires paralleling additional amplifier stages and their associated drive control circuitry.

Doherty type amplifier circuits would become more attractive if their efficiency were raised at low output power levels. In particular, in multicarrier power amplifier applications for cellular base station equipment in which the RF input signal applied to the multicarrier power amplifier may vary by as much as 30 dB.

Therefore, a need exists for a system and method for amplifying a signal in which the efficiency of a Doherty amplifier is increased over an extended dynamic range.

SUMMARY OF THE INVENTION

According to an aspect of the present invention, the foregoing need is addressed by an amplifier circuit including an amplifier having an input and an output, a first Doherty amplifier having an input coupled to the output of the amplifier, an output and a control input. The amplifier circuit also includes a detector having a detector input coupled to detect a first Doherty output signal from the output of the first Doherty amplifier, and an output. The output is coupled to an input of a controller, the controller having a first and second controller output. The amplifier circuit further includes a switching regulator having an input coupled to the first controller output, and an outputcoupled to the control input of the first Doherty amplifier. Correspondingly, the amplifier circuit includes a variable attenuator having a signal input, an output coupled to the input of the amplifier, and a control input coupled to the second controller output.

According to another aspect of the present invention, the foregoing need is addressed by a method for amplifying a signal, the method including receiving an input signal at an input of a variable attenuator, attenuating the input signal to form an attenuated signal, and amplifying the attenuated signal to form an amplified signal. The method also includes amplifying the amplified signal in a Doherty amplifier, generating a Doherty output signal in response to receiving a supply voltage provided by a switching regulator at a control input to the Doherty amplifier. Further, the method includes detecting a total signal in a detector, forming a detected output signal, the total signal including at least the first Doherty output signal comparing the detected output signal to a predetermined controller threshold in a controller, and generating a first and a second control signal in the controller if the detected output signal falls below the predetermined controller threshold. In response to the first control signal, generating a switching regulator output voltage in a switching regulator and then modifying a voltage of the first Doherty amplifier based upon the switching regulator output voltage. In response to the second control signal, modifying a voltage of the variable attenuator.

According to a further aspect of the present invention, the foregoing need is addressed by an amplifier circuit including a first Doherty amplifier having an input, a first Doherty control input, and an output, the output coupled to the input of a second Doherty amplifier having a second Doherty control input and an output. The amplifier circuit also includes a detector having a detector input coupled to detect a second Doherty output signal from the output of the second Doherty amplifier, and an output. The output is coupled to an input of a controller, the controller having a controller output. The amplifier circuit further includes a switching regulator having an input coupled to the controller output, and a first and second switching regulator output, the first switching regulator output coupled to the first Doherty control input and the second switching regulator output coupled to the second Doherty control input.

According to a fourth aspect of the present invention, the foregoing need is addressed by a method for amplifying a signal, the method including receiving the input signal at an input of a first Doherty amplifier, receiving a first supply voltage at a first Doherty control input of the first Doherty amplifier, amplifying the input signal in the first Doherty amplifier, forming a first Doherty output signal, receiving the first Doherty output signal at an input of a second Doherty amplifier, receiving a second supply voltage at a second Doherty control input of the second Doherty amplifier, and amplifying the first Doherty output signal in the second Doherty amplifier, forming a second Doherty output signal. The method further includes detecting a total signal, forming a detected output signal, the total signal including at least the second Doherty output signal, and then comparing the detected output signal to a predetermined controller threshold in a controller. In addition, the method includes generating a control signal in the controller if said detected output signal falls below the predetermined controller threshold, generating a first supply voltage in a switching regulatorbased upon the control signal and subsequently modifying a voltage of the first Doherty amplifier based upon the first supply voltage. Concurrently, generating a second supply voltage in the switching regulator based upon the control signal and subsequently modifying a voltage of the second Doherty amplifier based upon said second supply voltage.

Advantages of the present invention will become readily apparent to those skilled in the art from the following description of the preferred embodiment(s) of the invention which have been shown and described by way of illustration. As will be realized, the invention is capable of other and different embodiments, and its details are capable of modification in various respects. Accordingly, the drawings and descriptions are to be regarded as illustrative in nature and not as restrictive.

BRIEF DESCRIPTION OF THE DRAWINGS

FIG. 1 illustrates typical Doherty amplifier;

FIG. 3 is a block diagram of a circuit for amplifying a signal via increasing the efficiency of a Doherty amplifier according to a preferred embodiment of the present invention;

DETAILED DESCRIPTION OF THE PREFERRED EMBODIMENT

Turning now to the drawings, wherein like numerals designate like components, FIG. 1 depicts a typical Doherty amplifier. A Doherty amplifier 208 receives an input signal 206 and generates a Doherty output signal 220, in response to receiving a control input 234. The control input generally represents a voltage commonly referred to a the drain voltage and may be annotated as $V_{dd}$.

Figure 2:
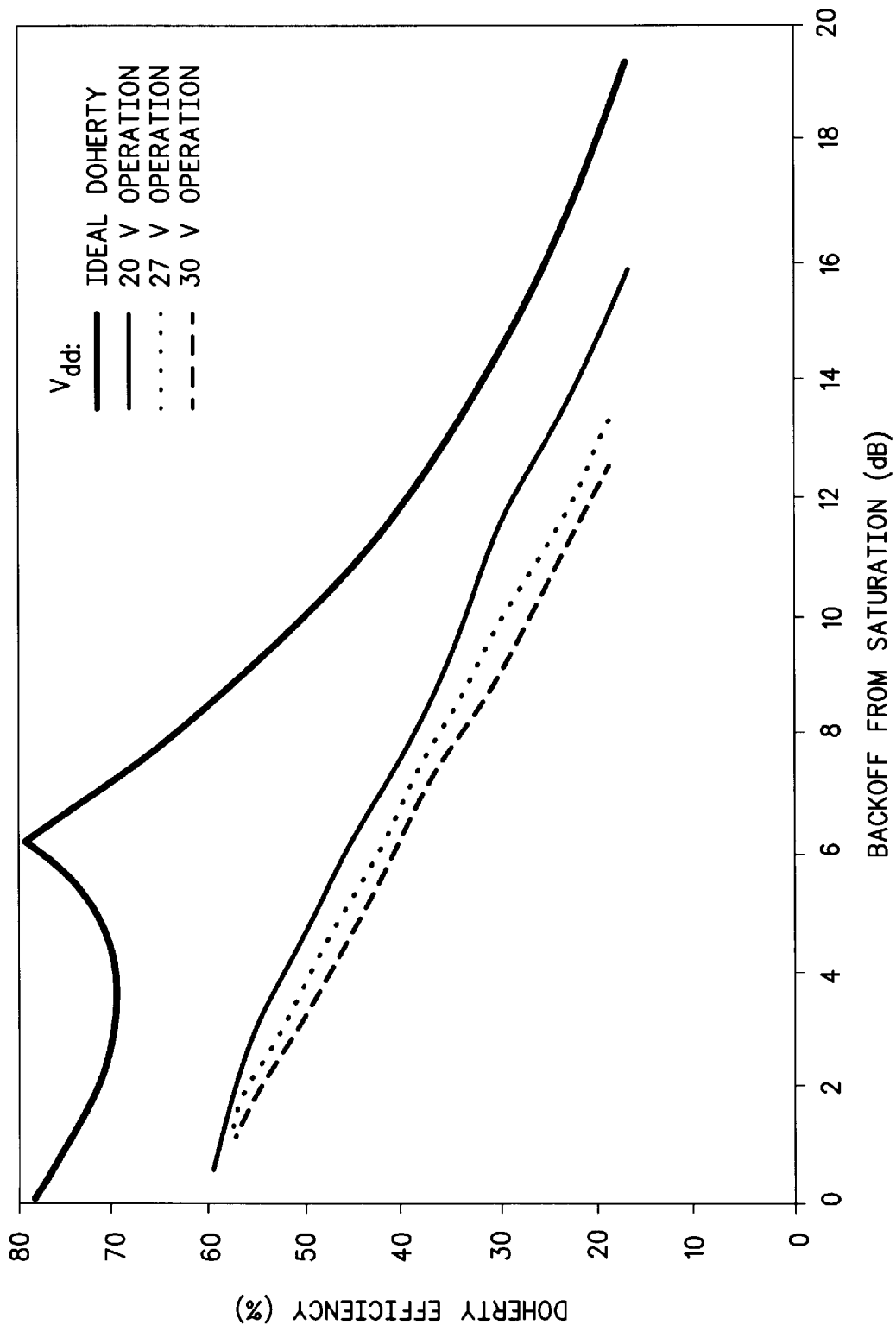
FIG. 2 is a graphical depiction of Doherty amplifier efficiency with respect to Doherty amplifier saturation, at multiple drain voltages.

Doherty amplifiers utilizing field effect transistors (FETs) typically operate with a fixed drain voltage. When Doherty output signal 220 is at saturated power, Doherty amplifier 208 operates at maximum drain efficiency. In other words, Doherty amplifier 208 operates at maximum efficiency when the voltage of Doherty output signal 220 is equal to the drain voltage $V_{dd}$. Saturation occurs at 0 dB backoff as shown in FIG. 2. Doherty efficiency, which is defined as the ratio of RF power output to the DC input power, drops slightly with increasing backoff from saturation until a transition voltage is reached at 6 dB from saturation. At a 6 dB backoff from saturation, maximum Doherty efficiency is again reached. Below the transition voltage, the Doherty efficiency falls off rapidly with increasing backoff from saturation. As is well known in the art, as the power of Doherty output signal 220 decreases, the efficiency of Doherty amplifier 208 is reduced proportionally to the output signal voltage amplitude. Therefore, when Doherty output signal 220 is low, Doherty efficiency is low. Conversely, when Doherty output signal 220 is high, Doherty efficiency is high. For example, a Doherty output signal power of 20 watts is approximately 40% efficiency for a fixed drain voltage of 20 volts, while a Doherty output signal power of 60 watts is approximately 57% efficiency for a fixed drain voltage of 20 volts.

As the drain voltage increases relative to a fixed output voltage, Doherty efficiency decreases. For example, at 6 dB backoff from saturation, in a 900 Mhz application, Doherty efficiency is approximately 46% for a fixed drain voltage of 20 volts and drops to approximately 40% for a fixed drain voltage of 30 volts.

There are two practical problems with operating a Doherty amplifier 208 at a low fixed drain voltage. One problem is an increase in intermodulation, also known as distortion, of Doherty output signal 220. This distortion may be mitigated by keeping the power of Doherty output signal 220 at a low value, for example, 9 to 10 dB below saturation. The other problem is a reduction in Doherty amplifier 208 power gain. The Doherty amplifier 208 power gain reduction may be accommodated by adding a variable attenuator together with a fixed gain provided by a driver amplifier. The variable attenuator and fixed gain driver amplifier are configured to offset a gain loss across Doherty amplifier 208.

Accordingly, it is possible to improve Doherty efficiency over a wider dynamic range by keeping Doherty amplifier 208 substantially near saturation. To maintain Doherty amplifier 208 near saturation, the supply voltage presented at control input 234 is adjusted in proportion to a voltage of Doherty output signal 220. In the preferred embodiment of the present invention, the adjustable supply voltage presented at control input 234 replaces the aforementioned fixed supply (or drain) voltage, $V_{dd}$.

FIG. 3 depicts a block diagram of an amplifier circuit 200 for amplifying a signal which results in an increase of Doherty amplifier efficiency according to a preferred embodiment of the present invention. Amplifier circuit 200 is configured with an input 201 and an output 240. Amplifier circuit 200 includes a variable attenuator 202, an amplifier 204, a first Doherty amplifier 208, a detector 224, a controller 228, and a switching regulator 232. An input signal 250 (e.g. a multicarrier 900 megahertz (Mhz) RF signal which may be generated by a plurality of RF transceivers) is received at input 201.

In the operation of circuit 200, an amplifier 204, preferably a driver amplifier, has an input for receiving an attenuated signal generated by variable attenuator 202, and provides an input signal 206 to first Doherty amplifier 208. First Doherty amplifier 208 receives input signal 206 and generates a first Doherty output signal 220 in response to receiving a supply voltage provided by switching regulator 232 at control input 234. In a preferred embodiment, detector 224, preferably a diode detector, is coupled to the output of first Doherty amplifier 208 by means of a directional coupler (not shown). Detector 224 samples and rectifies the first Doherty output signal, and provides a detected output signal 226 to controller 228. Detected output signal 228 is a direct current (DC) voltage proportional to the signal detected at a detector input 222.

If detected output signal 226 falls below a predetermined controller threshold, for example a threshold voltage, controller 228 will generate a first and second control signal. Accordingly, controller 228 converts detected output signal 226 into a first control signal 230 suitable for input to switching regulator 232. The conversion is such that switching regulator 232 will decrease the supply voltage provided as control input 234 to first Doherty amplifier 208, in response to a decrease in the detected output signal. As a result, the voltage gain (first gain) across first Doherty amplifier 208 decreases.

Concurrently, controller 228 converts detected output signal 226 into a second control signal 231 suitable for input to variable attenuator 202. The conversion is such that the variable attenuator will decrease the attenuation of input signal 250, consequently increasing the signal appearing at the input of first Doherty amplifier 208. As a result, voltage gain (second gain) across the sum of variable attenuator 202 and driver amplifier 204 increases.

The resulting voltage decrease across first Doherty amplifier 208 coupled with the resulting voltage increase across the sum of variable attenuator 202 and driver amplifier 204, keeps Doherty amplifier 208 near it's saturation point over a wider dynamic range. Correspondingly, the sum of the first and second gain remains substantially constant across amplifier circuit 200.

Amplifier 204 and Doherty amplifier 208 are preferably metal oxide semiconductor field effect transistor (MOSFET)

amplifiers, such as the MRF 183 Series amplifiers available from Motorola, Inc. Variable attentuator 202 is preferably an AT-108 voltage variable absorptive attenuator made by M/A-COM, Inc. Detector 224 may be a MA4E932A Zero Bias Detector diode, also made by M/A-COM, Inc. Switching regulator 232 may be any number of types of switching regulators similar to the AT&T version FE150R DC-DC Power Module. Controller 228 may be implemented by either software or hardware methods. For example, controller 228 may be realized as a hard coded look-up table or as an analog circuit including level shifting and scaling operational amplifiers.

Figure 4:
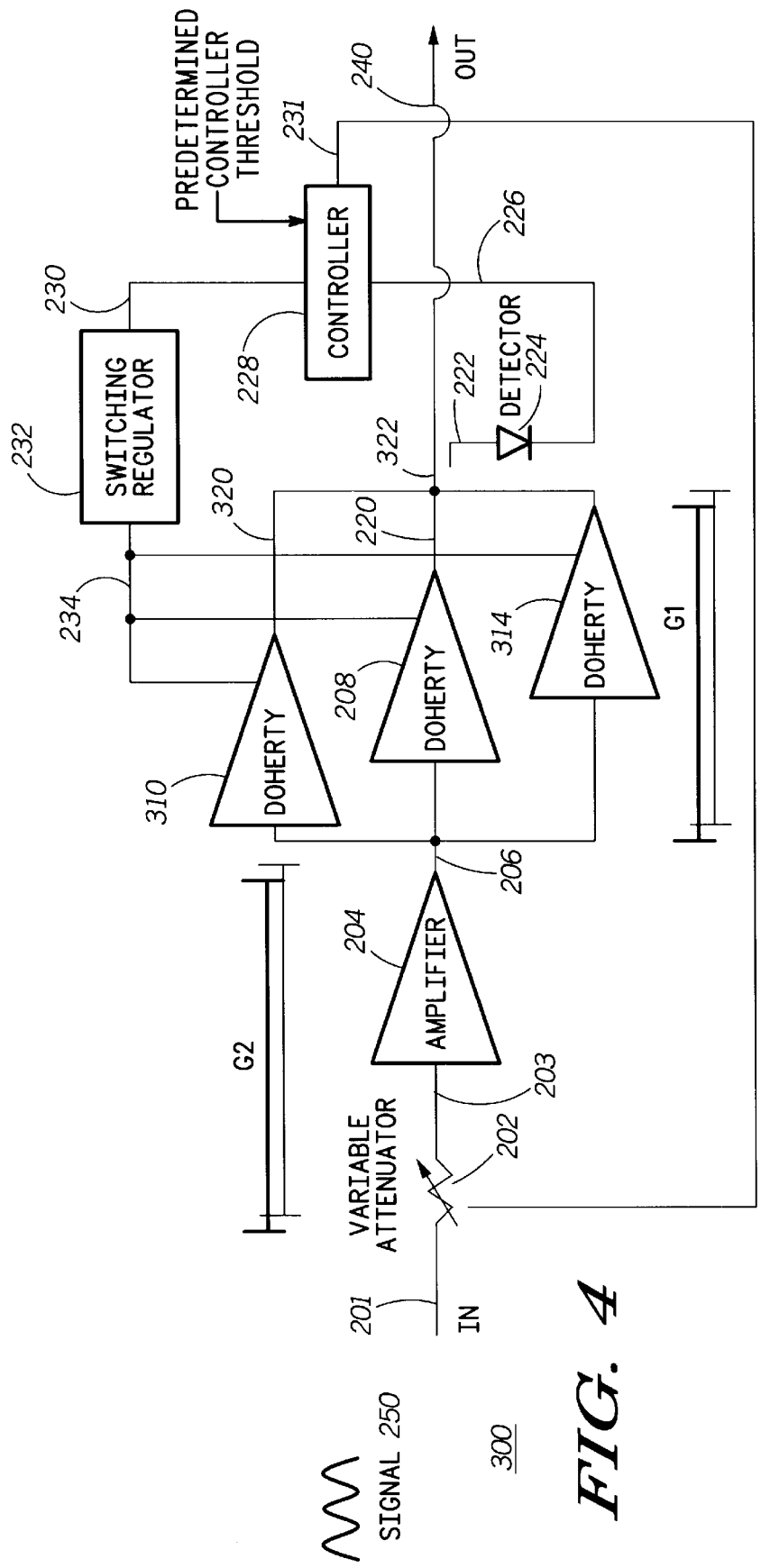
FIG. 4 is a block diagram of a variation of the circuit depicted in FIG. 3.

In an alternate amplifier circuit 300 shown in FIG. 4, a second Doherty amplifier 310 may be added in a parallel arrangement with Doherty amplifier 208 such that second Doherty amplifier 310 has an input coupled to the input of Doherty amplifier 208 and an output coupled the output of Doherty amplifier 208, as illustrated. Second Doherty amplifier 310 also has a control input coupled to the output of switching regulator 232. The additive effect of first Doherty output signal 220 and a second Doherty output signal 320 output by second Doherty amplifier 310, produces a total signal 322. Additional Doherty amplifiers may also be added in parallel, depending on the magnitude of the desired total signal 322. Accordingly, the feedback configuration shown in FIGS. 3 and 4, increases the efficiency of the Doherty amplifier over an extended dynamic range.

Figure 5:
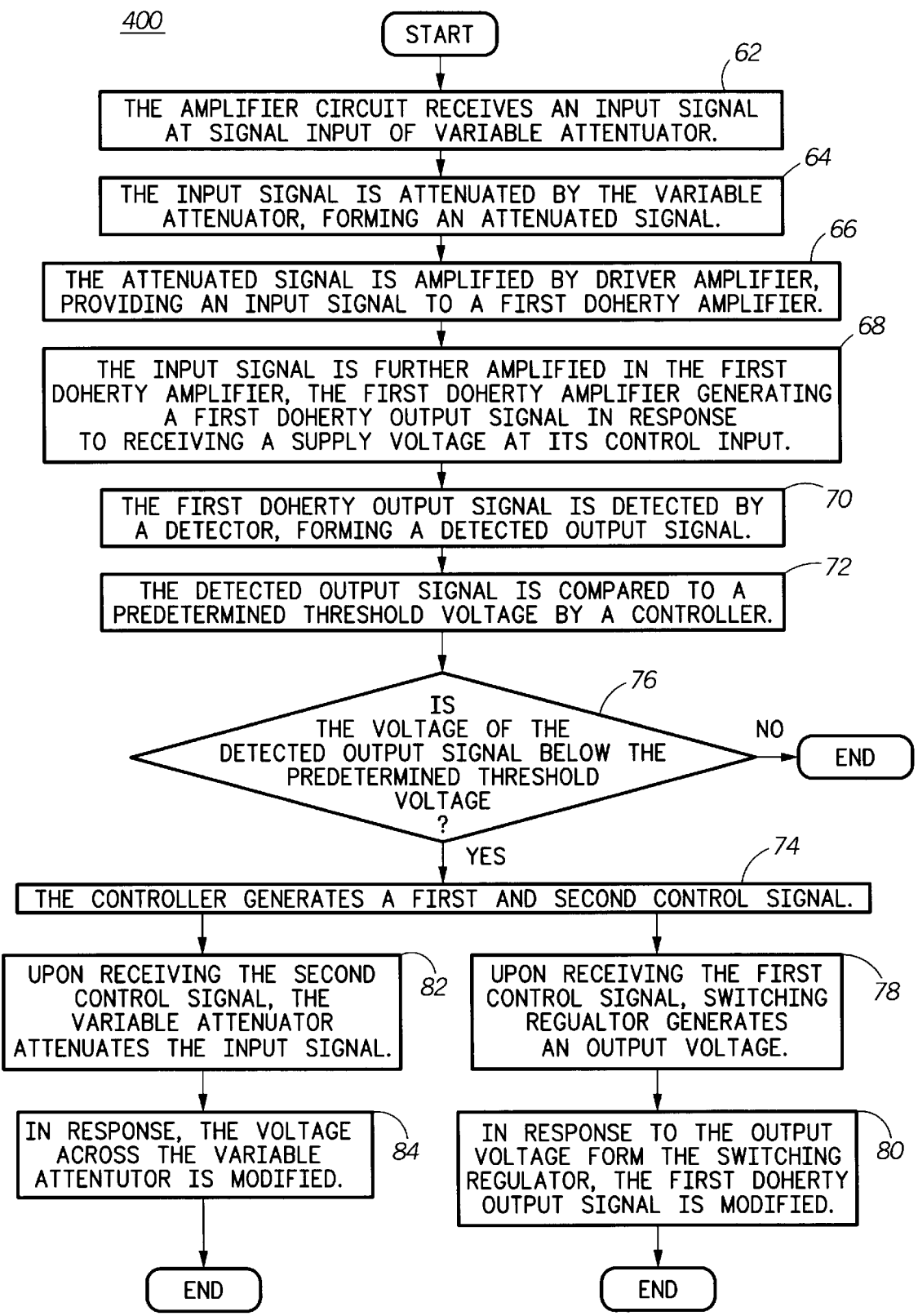
FIG. 5 is a flow chart of a method for amplifying a signal according to a preferred embodiment of the present invention.

In FIG. 5 a flow chart representing a method, generally designated 400 of amplifying a signal, is illustrated. Method 400 starts at block 62 where amplifier circuit 200 receives an input signal 250 at input 201. Next at block 64, input signal 250 is attenuated by variable attenuator 202, forming an attenuated signal. At block 66, the attenuated signal is amplified by driver amplifier 204, providing an input signal 206 to a first Doherty amplifier 208. Next, at block 68 first Doherty amplifier 208 generates a first Doherty output signal 220 in response to receiving a supply voltage at control input 234.

Next first Doherty output signal 220 is detected by detector 224, which generates a detected output signal 226, at block 70. Detected output signal 226 is compared to a threshold voltage by controller 228, at block 72. If the voltage of detected output signal 226 is below the threshold voltage, controller 228 generates a first control signal 230 and a second control signal 231 at block 74. If the voltage of detected output signal 226 is above the threshold voltage, controller 228 will not generate a first and second control signal. At block 78, upon receiving first control signal 230, switching regulator 232 generates an output which appears as a supply voltage at control input 234 of first Doherty amplifier 208. The supply voltage is proportional to first control signal 230. In response to the supply voltage, first Doherty output signal 220 is modified at block 80. Concurrently, upon receiving second control signal 231, variable attenuator 202 attenuates input signal 250 at block 82. In response, at block 84, the voltage across the sum of variable attenuator 202 and amplifier 204 is modified.

Figure 6:
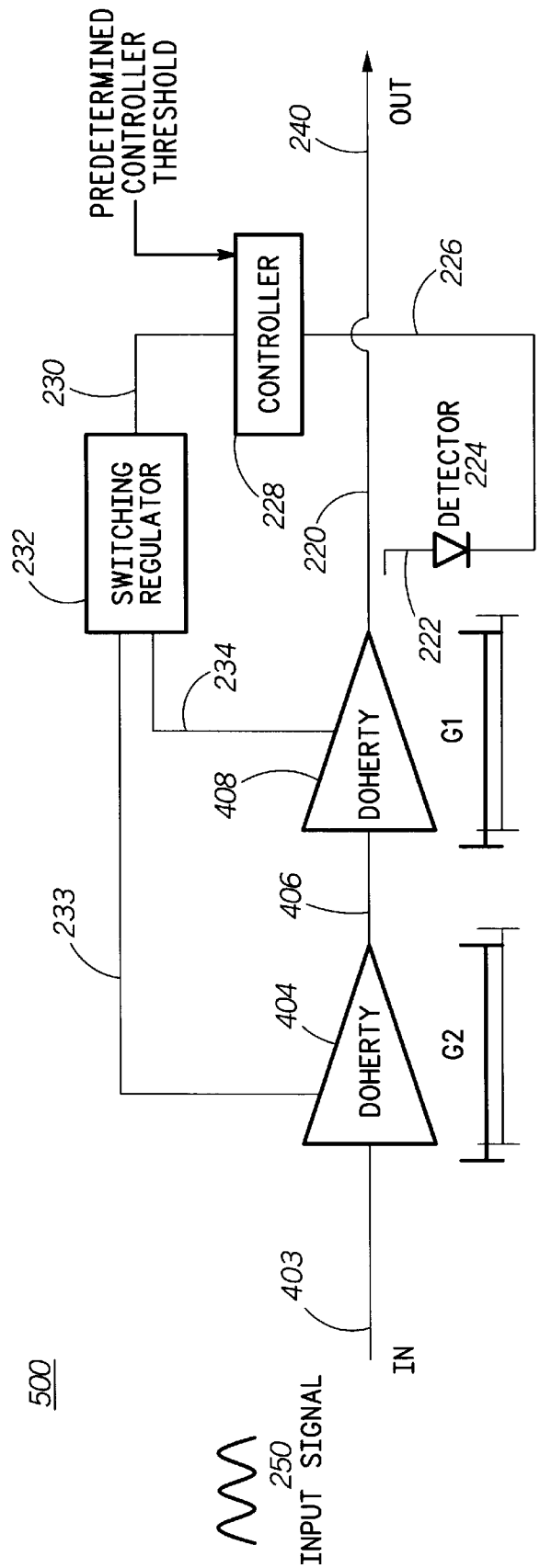
FIG. 6 is a block diagram of a circuit for amplifying a signal via increasing the efficiency of a Doherty amplifier according to another embodiment of the present invention.

A third embodiment depicted in FIG. 6 allows further amplifier circuit enhancement by replacing amplifier 204 with a Doherty amplifier 404. An amplifier circuit 500 is configured with an input 403 and an output 240. Amplifier circuit includes a variable attenuator 202, a first Doherty amplifier 404, a second Doherty amplifier 408, a detector 224, a controller 228, and a switching regulator 232. An input signal 250 (e.g. a multicarrier 900 megahertz (Mhz) RF signal which may be generated by a plurality of RF transceivers) is received at input 403.

In the operation of amplifier circuit 500, first Doherty amplifier 404 receives input signal 250 at input 403 and generates a first Doherty output signal 406 based upon a first supply voltage from switching regulator 232 provided to a first Doherty control input 233. Second Doherty amplifier 408 receives first Doherty output signal 406 and generates a second Doherty output signal 220, based upon a second supply voltage from switching regulator 232 received at a second Doherty control input 234.

In a preferred embodiment, detector 224, preferably a diode detector, is coupled to the output of second Doherty amplifier 408 by means of a directional coupler (not shown). Detector 224 samples and rectifies second Doherty output signal 220, and provides a detected output signal 226 to controller 228. Detected output signal 226 is a direct current (DC) voltage proportional to the signal detected at a detector input 222.

If detected output signal 226 is above a predetermined controller threshold, for example a threshold voltage, controller 228 does not generate a control signal. If detected output signal 226 falls below the threshold voltage, controller 228 will convert detected output signal 226 to a first control signal 230 suitable for input to switching regulator 232. The conversion is such that switching regulator 232 will decrease the supply voltage provided at second Doherty control input 234. As a consequence, the voltage gain of second Doherty amplifier 408 decreases in response to a decrease in detected output signal 226.

Concurrently, switching regulator 232 will increase the supply voltage provided at first Doherty control input 233. As a result, the voltage gain of first Doherty amplifier 404 increases, in response to a decrease in detected output signal 226. The voltage gain increase across first Doherty amplifier 404 coupled with the voltage loss across second Doherty amplifier 408 results in a substantially constant voltage across amplifier circuit 500 which maintains second Doherty amplifier 408 operation near it's saturation point.

Figure 7:
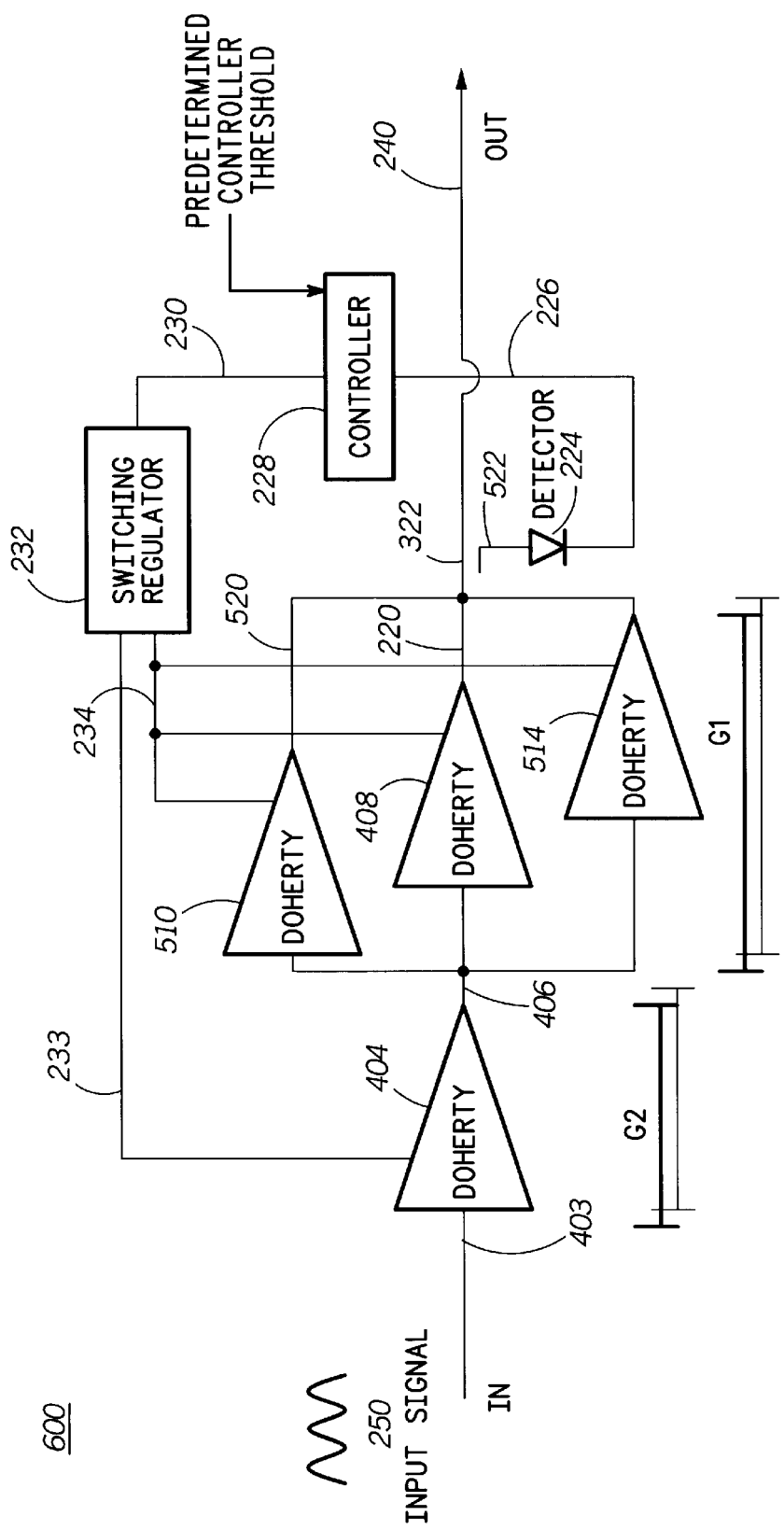
FIG. 7 is a block diagram of a variation of the circuit depicted in FIG. 6.

In an fourth embodiment shown in FIG. 7, a third Doherty amplifier 510 may be added in a parallel arrangement with second Doherty amplifier 408 such that third Doherty amplifier 510 has an input coupled to the input of second Doherty amplifier 408 and an output coupled the output of second Doherty amplifier 408, as illustrated. Third Doherty amplifier 510 receives first Doherty output signal 406 and generates a third Doherty output signal 520, based upon the second supply voltage from switching regulator 232 received at third Doherty control input 234. The additive effect of second Doherty output signal 220 and third Doherty output signal 520, produces a total signal 322. Additional Doherty amplifiers may be added in parallel, depending on the magnitude of the desired total signal 322.

Figure 8:
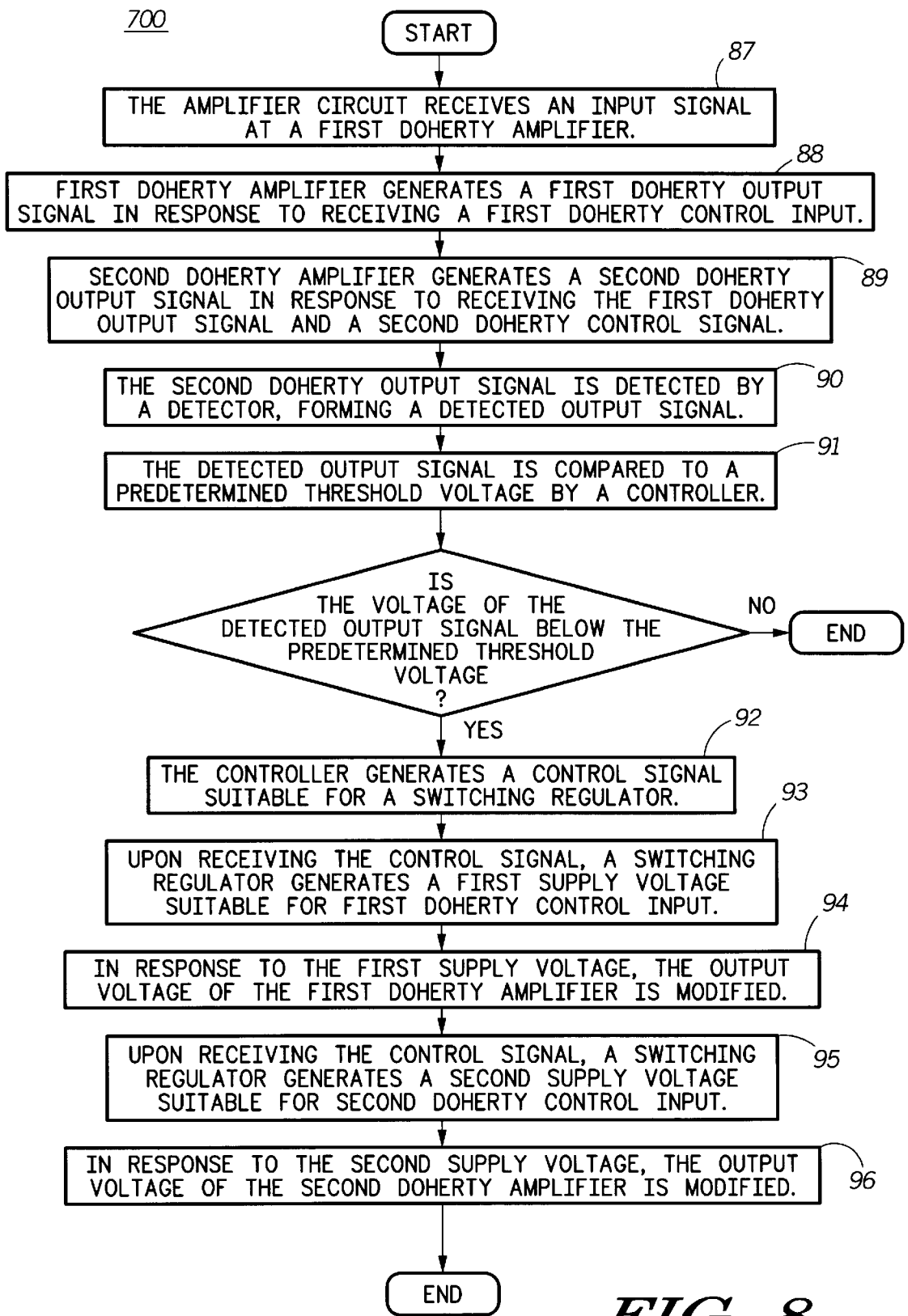
FIG. 8 is a flow chart of a method for amplifying a signal according to the embodiment of FIG. 6.

In FIG. 8 a flow chart representing a method, generally designated 700 of amplifying a signal, is illustrated. Method 700 starts at block 87 where amplifier circuit 500 receives an input signal 250 at input 403. Next at block 88, first Doherty amplifier 404 generates a first Doherty output signal 406 in response to receiving a first Doherty control input 233. First Doherty control input 233 represents a supply voltage from switching regulator 232. Next at block 89, second Doherty amplifier 408 generates a second Doherty output signal 220 in response to receiving first Doherty output signal 406 and a second Doherty control input 234.

At block 90, second Doherty output signal 220 is detected by detector 224, which generates a detected output signal 226. Detected output signal 226 is compared to a threshold voltage by controller 228, at block 91. If the voltage of detected output signal 226 is below the threshold voltage, controller 228 generates a control signal 230 at block 92. If the voltage of detected output signal 226 is above the threshold voltage, controller 228 will not generate a control signal 230. At block 93, upon receiving control signal 230, switching regulator 232 generates an output which appears as a first supply voltage at first Doherty control input 233. In response to first Doherty control input 233, first Doherty output signal 406 is modified at block 94. Concurrently, at block 95, upon receiving control signal 230, switching regulator 232 generates an output which appears as a second supply voltage at second Doherty control input 234. In response, second Doherty output signal 420 is modified at block 96. Subsequently, the modification to first and second Doherty output signals substantially maintain amplifier circuit 500 gain at a constant level with minimum distortion to the Doherty output signals. In addition, Doherty amplifier operation occurs near maximum efficiency.

It will be apparent that other forms of the invention, and embodiments other than the specific embodiments described above, may be devised without departing from the spirit and scope of the appended claims and their equivalents, and therefore it is intended that the scope of this invention will only be governed by the following claims and their equivalents.

What I claim is:

1. An amplifier circuit comprising:
   an amplifier having an input and an output;
   a first Doherty amplifier having an input coupled to said output of said amplifier, an output and a control input;
   a detector having a detector input coupled to detect a first Doherty output signal of said output of said first Doherty amplifier, and an output;
   a controller having an input coupled to said output of said detector, and a first output and a second output;
   a switching regulator having an input coupled to said first output of said controller, and an output coupled to said control input of said first Doherty amplifier; and
   a variable attenuator having a signal input, an output coupled to said input of said amplifier, and a control input coupled to said second output of said controller.

2. The amplifier circuit according to claim 1, wherein a first gain of said amplifier circuit comprises a voltage across said first Doherty amplifier.

3. The amplifier circuit according to claim 2, wherein a second gain of said amplifier circuit comprises a voltage across a sum of said variable attenuator and said amplifier.

4. The amplifier circuit according to claim 3, wherein a sum of said first gain and said second gain is substantially constant.

5. The amplifier circuit according to claim 1, further comprising a second Doherty amplifier having an input coupled to said input of said first Doherty amplifier, an output coupled to said output of said first Doherty amplifier, and a control input coupled to said output of said switching regulator.

6. The amplifier circuit according to claim 1, wherein the amplifiers comprise a radio frequency transistor semiconductor device.

7. A method of amplifying an input signal, the method of amplifying comprising the steps of:
   receiving said input signal at a signal input of a variable attenuator;
   attenuating said input signal forming an attenuated signal;
   amplifying said attenuated signal forming a amplified signal;
   amplifying said amplified signal in a first Doherty amplifier forming a first Doherty output signal;
   detecting a total signal in a detector forming a detected output signal, said total signal comprising at least said first Doherty output signal;
   comparing said detected output signal to a predetermined controller threshold in a controller;
   generating a first control signal and a second control signal in said controller if detected output signal falls below said predetermined controller threshold;
   generating a switching regulator output voltage in a switching regulator based upon said first control signal;
   modifying a voltage of said first Doherty amplifier based upon said switching regulator output voltage; and
   modifying a voltage of said variable attenuator based upon said second control signal.

8. The method according to claim 7, wherein a first gain of said amplifier circuit comprises said voltage modification across said first Doherty amplifier.

9. The method according to claim 8, wherein a second gain of said amplifier circuit comprises a sum of said voltage modification of said variable attenuator and said amplifier.

10. The amplifier circuit according to claim 9, wherein a sum of said first gain and said second gain is substantially constant.

11. The method according to claim 7, further comprising the steps of:
    amplifying said amplified signal in a second Doherty amplifier forming a second Doherty output signal; and
    combining said first and second Doherty output signals forming said total signal.

12. An amplifier circuit comprising:
    a first Doherty amplifier having an input, a first Doherty control input, and an output;
    a second Doherty amplifier having an input coupled to said output of said first Doherty amplifier, an output, and a second Doherty control input;
    a detector having a detector input coupled to detect a second Doherty output signal of said output of said second Doherty amplifier, and an output;
    a controller having an input coupled to said output of said detector, and an output; and
    a switching regulator having an input coupled to said output of said controller, and first and second switching regulator output, the first switching regulator output coupled to said first Doherty control input and the second switching regulator output coupled to said second Doherty control input.

13. The amplifier circuit according to claim 12, wherein a first gain of said amplifier circuit comprises a voltage across said second Doherty amplifier.

14. The amplifier circuit according to claim 13, wherein a second gain of said amplifier circuit comprises a voltage across said first Doherty amplifier.

15. The amplifier circuit according to claim 14, wherein a sum of said first gain and said second gain is substantially constant.

16. The amplifier circuit according to claim 12, further comprising a third Doherty amplifier having an input coupled to said input of said second Doherty amplifier, an output coupled to said output of said second Doherty amplifier, and a control input coupled to said second switching regulator output.

17. The amplifier circuit according to claim 12, wherein said Doherty amplifier comprises a radio frequency transistor semiconductor device.

18. A method of amplifying an input signal, the method of amplifying comprising the steps of:

receiving said input signal at an input of a first Doherty amplifier;

receiving a first supply voltage at a first Doherty control input of said first Doherty amplifier;

amplifying said input signal in said first Doherty amplifier forming a first Doherty output signal;

receiving said first Doherty output signal at an input of a second Doherty amplifier;

receiving a second supply voltage at a second Doherty control input of said second Doherty amplifier;

amplifying said first Doherty output signal in said second Doherty amplifier forming a second Doherty output signal;

detecting a total signal, forming a detected output signal, said total signal comprising at least said second Doherty output signal;

comparing said detected output signal to a predetermined controller threshold in a controller;

generating a control signal in said controller if said detected output signal falls below said predetermined controller threshold;

generating a first supply voltage in a switching regulator based upon said control signal;

modifying a voltage of said first Doherty amplifier based upon said first supply voltage;

generating a second supply voltage in said switching regulator based upon said control signal; and modifying a voltage of said second Doherty amplifier based upon said second supply voltage.

19. The method according to claim 18, wherein a first gain of said amplifier circuit comprises said voltage modification of said second Doherty amplifier.

20. The method according to claim 19, wherein a second gain of said amplifier circuit comprises said voltage modification of said first Doherty amplifier.

21. The amplifier circuit according to claim 20, wherein a sum of said first gain and said second gain is substantially constant.

22. The method according to claim 18, further comprising the steps of:

amplifying said first Doherty output signal in a third Doherty amplifier forming a third Doherty output signal; and combining said second Doherty output signal and third Doherty output signal forming said total signal.

23. The method according to claim 18, wherein said predetermined controller threshold is selected based upon a measured input signal power.

\* \* \* \* \*